United States Patent
Saida et al.

(10) Patent No.: US 6,284,583 B1
(45) Date of Patent: Sep. 4, 2001

(54) SEMICONDUCTOR DEVICE AND METHOD OF MANUFACTURING THE SAME

(75) Inventors: Shigehiko Saida; Yoshitaka Tsunashima, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/105,024

(22) Filed: Jun. 26, 1998

(30) Foreign Application Priority Data

Jun. 30, 1997 (JP) ................................................ 9-174681
Jun. 15, 1998 (JP) ................................................ 10-167092

(51) Int. Cl.[7] ........................................... H01L 21/8249
(52) U.S. Cl. ........................ 438/216; 438/239; 438/791
(58) Field of Search ............................... 438/197, 216, 438/239, 240, 791

(56) References Cited

U.S. PATENT DOCUMENTS

| | | | |
|---|---|---|---|
| 4,395,438 | * 7/1983 | Chiang | 438/791 |
| 4,692,344 | * 9/1987 | Kaganowicz et al. | 427/39 |
| 4,717,602 | * 1/1988 | Yamazaki | 427/53.1 |
| 5,264,724 | * 11/1993 | Brown et al. | 257/347 |
| 5,753,541 | * 5/1998 | Shimizu | 438/161 |
| 5,917,225 | * 6/1999 | Yamazaki et al. | 257/411 |
| 5,981,404 | * 11/1999 | Sheng et al. | 438/791 |

FOREIGN PATENT DOCUMENTS

| | | |
|---|---|---|
| 02-186632 | 7/1990 | (JP) . |
| 04-209536 | 7/1992 | (JP) . |
| 06-283684 | 10/1994 | (JP) . |
| 09-50996 | 2/1997 | (JP) . |

* cited by examiner

Primary Examiner—Sara Crane
(74) Attorney, Agent, or Firm—Finnegan, Henderson, Farabow, Garrett & Dunner, L.L.P.

(57) ABSTRACT

A semiconductor device comprises a semiconductor substrate and a silicon nitride film formed on the semiconductor substrate. The silicon nitride film is substantially free from an Si—H bond and has an Si—H density per unit area of $1 \times 10^{15}$ cm$^{-2}$ or less.

20 Claims, 13 Drawing Sheets

SEMICONDUCTOR DEVICE AND METHOD OF MANUFACTURING THE SAME

BACKGROUND OF THE INVENTION

The present invention relates to a semiconductor device using a silicon nitride film as an insulating film, and a method of manufacturing the same.

A semiconductor memory device has been widely used as a memory device for use in an information processing apparatus in recent years. The semiconductor memory device is highly resistive to mechanical shock due to the absence of a mechanical driving mechanism. In addition, it is possible for the semiconductor memory to gain high-speed access since a reading-out operation is electrically performed.

However, the tendency toward miniaturization of memory cells, that is, high integration of the semiconductor memory device, has been accelerated by recent progress in semiconductor technologies, particularly in miniaturization technologies. With the high integration of the semiconductor memory device, problems are raised regarding memory cell storage characteristics.

For example, in a DRAM having a memory cell consisting of a MOS transistor and a capacitor connected in series, capacitance is inclined to decrease with reduction in capacitor area due to the high integration. As a result, problems called "soft error" occur. The soft errors are phenomena where a different memory is mistakenly read out, and where a stored memory data is broken by an $\alpha$ ray.

To solve the soft error problems, it is important that the capacitance is maintained even if the memory cell is reduced in size. To attain this, it is necessary to increase a capacitor area as well as to reduce thickness of a capacitor insulating film.

As the capacitor insulating film, a silicon nitride film, which has a higher dielectric constant than a silicon oxide film, has been widely used. The silicon nitride film of this type has hitherto been formed by a low pressure CVD method. However, the silicon nitride film thus formed has a drawback in that a leakage current is likely to increase.

BRIEF SUMMARY OF THE INVENTION

An object of the present invention is to provide a semiconductor device using a silicon nitride film with a low leakage current.

To attain the object, a semiconductor device according to a first aspect of the present invention comprises:
 a semiconductor substrate; and
 a silicon nitride film formed on the semiconductor substrate, the silicon nitride film being substantially free from an Si—H bond.

The density of Si—H contained in a unit area of the silicon nitride film is $1 \times 10^{15}$ cm$^{-2}$ or less.

It is preferable that the silicon nitride film have a film thickness within 4 nm to 8 nm.

The silicon nitride film may have a stacked structure having unit layers of 2 nm or less in thickness stacked one upon another.

The silicon nitride film may be used in at least one of a capacitor insulating film and a gate insulating film.

The silicon nitride film is substantially free from an N—H bond.

A method of manufacturing a semiconductor device according to a second aspect of the present invention comprises the steps of:

loading a substrate in a low pressure CVD apparatus; and
 forming a silicon nitride film substantially free from an Si—H bond by introducing a predetermined silicon source gas into the low pressure CVD apparatus.

The step of forming the silicon nitride film includes a step of forming a silicon nitride film having an Si—H density per unit area of $1 \times 10^{15}$ cm$^{-2}$ or less.

A silicon source gas free from an Si—H bond is used as the predetermined silicon source gas.

The predetermined silicon source gas desirably contains silicon whose bonds are entirely bonded to at least one element selected from the group consisting of silicon, nitrogen, and halogen.

The predetermined silicon source gas is preferably one of tetrachlorosilane, hexachlorodisilane, tetrakisdimethylaminosilane and trichlorosilylazide.

The step of forming a silicon nitride film can further comprise the steps of:
 forming the silicon nitride film by using the predetermined silicon source gas having an Si—H bond;
 reducing hydrogen contained in the silicon nitride film by a heat treatment; and
 forming a silicon nitride film having an Si—H density per unit area of $1 \times 10^{15}$ cm$^{-2}$ or less.

It is preferable that the heat treatment be performed at a temperature within a range of 900° C. to 1100° C.

A method of manufacturing a semiconductor device according to a third aspect of the present invention comprises:
 a step of loading a semiconductor substrate into a chamber;
 a first step of introducing a silicon-containing gas into a chamber;
 a second step of performing a first annealing of the semiconductor substrate in the silicon-containing gas at a temperature within 600 to 900° C. and a pressure within 0.1 Torr to 10 Torr;
 a third step of exhausting the silicon-containing gas after the first annealing;
 a fourth step of introducing a nitrogen-containing gas after the third step;
 a fifth step of performing a second annealing of the semiconductor substrate in the nitrogen-containing gas at a temperature within 600 to 1000° C. and a pressure within 0.5 Torr to 100 Torr;
 a sixth step of exhausting the nitrogen-containing gas after the fifth step; and
 a step of repeating the first to sixth steps a plurality of times.

It is desirable that the silicon-containing gas include at least one of tetrachlorosilane, trichlorosilane, and dichlorosilane.

It is desirable that the nitrogen-containing gas include at least one of ammonia, nitrogen trifluoride, hydrazine, dimethylhydrazine and monomethylhydrazine.

A step of thermally nitriding the semiconductor substrate can be included before the first step.

Furthermore, before the first step, it is possible to further include the steps of:
 forming a native oxide film on a surface of a semiconductor substrate; and
 removing the native oxide film.

Moreover, before the first step, it is possible to comprise the steps of:
 forming a native oxide film on a surface of the semiconductor substrate; and annealing the native oxide film in hexachlorodisilane.

It is desirable that the temperature of the annealing performed in hexachlorodisilane is 400° C. or less.

It is preferable that the third and sixth steps include the step of replacing anyone of the silicon containing gas and the nitrogen containing gas with anyone of an inert gas, a hydrogen chloride gas and a hydrogen gas.

It is preferable that an Si—H density per unit area of the silicon nitride film formed in the fifth step is $1 \times 10^{15}$ cm$^{-2}$ or less.

The silicon nitride film formed in the fifth step may have a film thickness of 2 nm or less.

The present invention is made based on the following findings.

The silicon nitride film for use in the capacitor insulating film is formed conventionally by a low-pressure CVD method. The silicon nitride film formed by this method contains a large amount of hydrogen ($3 \times 10^{21}$ cm$^{-3}$ or more).

In this case, hydrogen contained in the silicon nitride film forms an Si—H bond and an N—H bond. However, since the binding ability of the Si—H bond is especially weak, there are a large number of silicon dangling bonds present in the silicon nitride film. The silicon dangling bond will serve as an electron and hole trap. This means that if the silicon nitride film has a number of silicon dangling bonds, the leakage current will increase.

The leakage current may be reduced by decreasing Si—H concentration so that the number of silicon dangling bonds may decrease. It is found that the Si—H density per unit area of $1 \times 10^{15}$ cm$^{-2}$ or less is good enough to reduce the leakage current sufficiently.

According to a semiconductor device of a first aspect of the present invention, the silicon nitride film has an Si—H density per unit area of $1 \times 10^{15}$ cm$^{-2}$ or less. Therefore, the silicon nitride film with a low leakage current can be realized.

In the present invention, the thickness of the silicon nitride film is set at 4 nm or more. If the silicon nitride film is formed within the thickness range, it can be formed in a well-controlled thickness.

Furthermore, to reduce the Si—H density per unit area, it is effective to reduce not only Si—H concentration but also film thickness. For example, if the film thickness is set at 8 nm or less as in the present invention, it is possible to form the silicon nitride film satisfying the requirement for the Si—H density of $\times 10^{15}$ cm$^{-2}$ or less, without difficulties.

In the present invention, it is possible to employ a stacked-form silicon nitride film. The stacked-form silicon nitride film can be easily constructed by repeating a manufacturing method according to a second aspect of the present invention for forming a film of a 2 nm or less in thickness.

The silicon nitride film of the present invention is particularly effective for use in a capacitor insulating film or a gate insulating film, which must be thin (5 nm or less in terms of an oxide equivalent film thickness) and must have a low leakage current.

In the method of manufacturing a semiconductor device according to a second aspect of the present invention, it is possible to form a silicon nitride film having an Si—H density per unit area of $1 \times 10^{15}$ cm$^{-2}$ or less by a low-pressure CVD method using a predetermined silicon source gas, that is, a silicon source gas free from an Si—H bond responsible for a silicon dangling bond (trap).

Hence, if the silicon source gas of this type is used, the number of Si—H bonds decreases, resulting in reduction of the dangling bond. Consequently, the leakage current decreases.

In the manufacturing method of the present invention, it is not necessary to form the silicon nitride film with a low Si—H concentration in the beginning. If the formed silicon nitride film is subjected to treatment for reducing the Si—H concentration, it is possible to form the silicon nitride film with an Si—H density per unit area of $1 \times 10^{15}$ cm$^{-2}$ or less. More specifically, if the silicon nitride film is subjected to a heat treatment after it is formed, Si—H present in the silicon nitride film can be reduced. Since the number of Si—H bonds is decreased by the heat treatment, the leakage current is reduced.

When the heat treatment is performed at a low temperature, outdiffusion of hydrogen rarely occurs. For the reason, the treatment temperature is set at 900° C. or more, and preferably at 950° C. or more. Whereas, if the treatment temperature is excessively high, other devices are adversely affected. Therefore, the treatment temperature is set at 1100° C. or less, and preferably, at 1050° C. or less.

According to the manufacturing method of the present invention, a silicon nitride with Si dangling bond is formed and then nitrided. It is therefore possible to terminate the silicon dangling bond with nitrogen. As a result, the silicon nitride film reduced in trap density can be obtained. The leakage current conducting through the trap is reduced.

A silicon nitride film having a region whose Si—H density per unit area is $1 \times 10^{15}$ cm$^{-2}$ or less can be formed by varying the nitriding conditions. If so, the leakage current due to the Si—H bond can be further reduced.

If the thickness of the silicon nitride with Si dangling bond is set at 2 nm or less, an entire film can be easily nitrided. Therefore, the leakage current can be effectively suppressed from increasing.

It is important to reduce impurities of the thin nitride film in order to reduce the leakage current from the film. When the nitride film is formed by a conventional CVD method, a large amount of hydrogen and chlorine is inevitably contained in the nitride film, causing current leakage.

In the manufacturing method of a semiconductor device according to a third aspect of the present invention, a silicon source gas and a nitrogen source gas are alternately supplied, with the result that these gases are not mixed with each other. Accordingly, it is possible to suppress a gas-phase reaction. As a result, hydrogen and chlorine are left only on the surface of the film, not in the film. In addition, the reaction proceeds in a self-limitation manner (the reaction amount is limited to a certain degree), the concentrations of hydrogen and chlorine left on the surface can be reduced by extending the heat treatment time sufficiently long.

The reason why the reaction proceeds in a self-limiting manner is that the Si source gas causes a reaction on the surface of the nitride film; however, the reaction rarely takes place on the Si surface at the low temperature without a decomposition of an Si source gas. For example, the study based on a molecular orbital method (shown in FIG. 13) clarifies that since an N—H bond present on the surface reacts with a tetrachlorosilane, releasing hydrogen chloride, the reaction producing N—SiCl$_3$ proceeds without energy barrier. Due to this film formation mechanism hydrogen and chlorine contents of the silicon nitride film are reduced and the leakage current can be reduced.

As described above, the semiconductor device of the present invention has a quite good step coverage which is advantageous for permitting the reaction to proceed in a self limiting manner.

When chlorosilane is used as a silicon source, the N—H bond present on the surface of the nitride film reacts with an Si—Cl bond derived from chlorosilane, thereby removing hydrogen effectively.

When an active nitrogen source such as ammonia or hydrazine is used, chlorine can be easily removed from the Si—Cl bond.

When the treatment is performed at a high temperature and a relatively high pressure, it is possible to further enhance the effect of removing hydrogen and chlorine. However, when the heat treatment is performed with a silicon-containing gas, the treatment must be performed at a temperature equal to or less than the temperature at which silicon source gas is decomposed. This is because if the heat treatment is performed at an excessively high temperature, silicon will deposit.

Similarly, if the pressure is increased, silicon is deposited due to a gas-phase reaction. Conversely, if the pressure is excessively low, a surface reaction rarely proceeds. Whereas, when the heat treatment is performed with a nitrogen containing gas, it is preferable that the treatment is performed at as high a temperature as possible.

If a substrate surface is thermally nitrided prior to the silicon nitride film deposition step, it is possible to increase the microscopic uniformity in thickness of the silicon nitride film, reducing the leakage current from the silicon nitride film. Particularly, if the native oxide film is thermally treated with hexachlorodisilane, a silicon nitride film can be formed on an extremely thin oxide film, in a low interface trap density and more uniform thickness than that formed by a conventional thermal nitriding method.

After completion of a predetermined treatment, each of source gases is replaced with an inert gas, hydrogen gas or a hydrogen chloride gas, thereby suppressing a reaction of each source gas in a gas phase. As a result, the bonds containing impurities, such as Si—Cl, Si—H, and N—H, are formed only in the uppermost surface. The compounds thus formed can be easily removed. As another advantage of the present invention, since the gas-phase reaction is suppressed, the dust generated during the film deposition step is successfully reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be described with reference to the accompanying drawings.

Embodiment 1

Figure 1A:
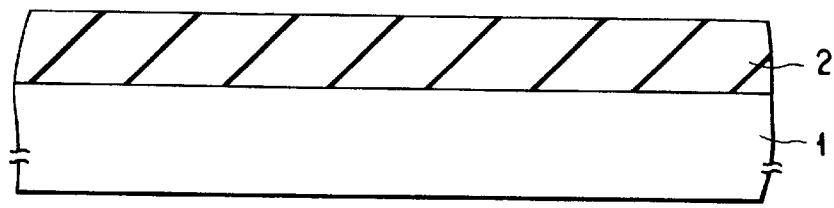
FIGS. 1A–1C are cross sectional views of a silicon nitride film according to Embodiment 1 of the present invention, for sequentially showing the manufacturing steps thereof.
Figure 1B:
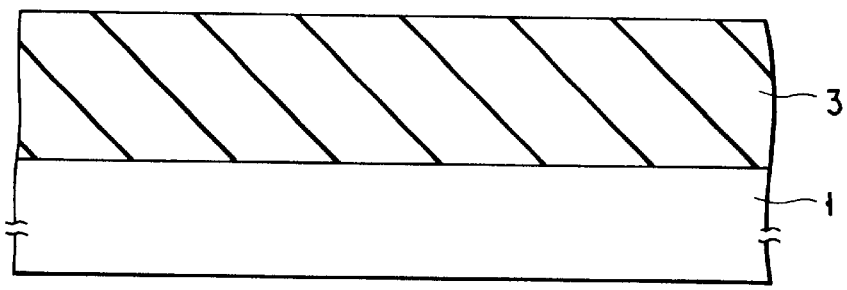
Figure 1C:
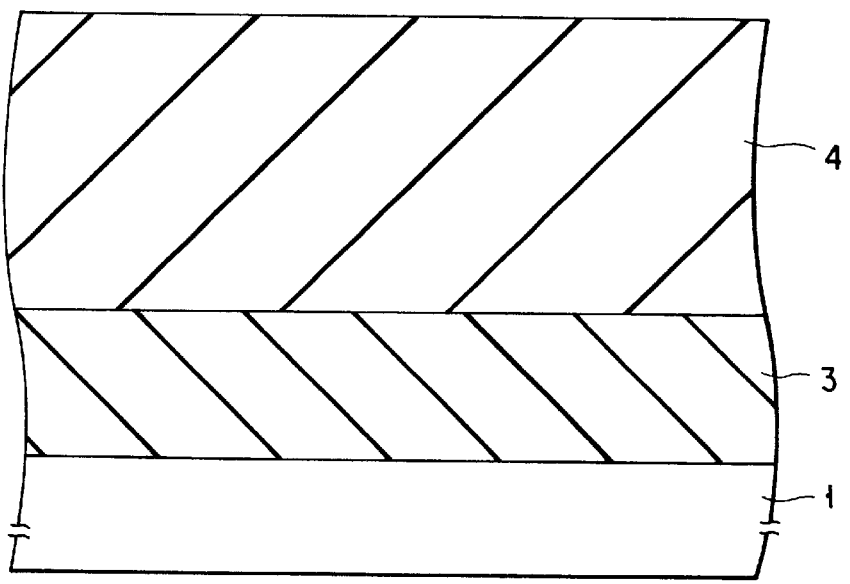

FIGS. 1A–1C are cross-sectional views of a silicon nitride film according to Embodiment 1 of the present invention, for sequentially showing the manufacturing steps thereof. A silicon nitride film is used herein as a capacitor insulating film.

As shown in FIG. 1A, contaminants such as metal present on a silicon substrate 1 are cleaned with a mixed solution (cleaning solution) of hydrochloric acid and hydrogen peroxide. Since hydrogen peroxide is contained in the cleaning solution, a native oxide layer 2 is inevitably formed on the silicon substrate 1 at the time of washing. The thickness of the native oxide film layer 2 is, for example, about 1.0 nm.

As shown in FIG. 1B, the substrate 1 is heated at 900° C. and 10 Torr for 1 hour in an ammonia atmosphere. As a result, a thermal nitride layer 3, that is, a nitrided native oxide film layer having a thickness of 2 nm, is formed on the surface of silicon substrate 1. In this manner, the native oxide layer 2 is converted into the nitrided native oxide film layer 3, which is thicker than the original native oxide film layer 2.

As shown in FIG. 1C, a silicon nitride film 4 of 4.0 nm thick (serving as a capacitor insulating film) is formed on the thermal nitride film 3 by a low pressure CVD method using a mixed gas of tetrachlorosilane and ammonia as a source gas at a film-formation pressure of 0.5 Torr and a film formation temperature of 700° C.

In this manner, it is possible to form the silicon nitride film 4 having a hydrogen density per unit area of $1\times10^{15}$ $cm^{-2}$ or less. Thereafter, an upper electrode (not shown) is formed, thereby accomplishing a capacitor.

In this embodiment, the silicon nitride film 4 is formed on the thermal nitride film 3. However, the silicon nitride film 4 may be formed after the native oxide film present on the surface of the silicon substrate 1 is completely removed.

Figure 2:
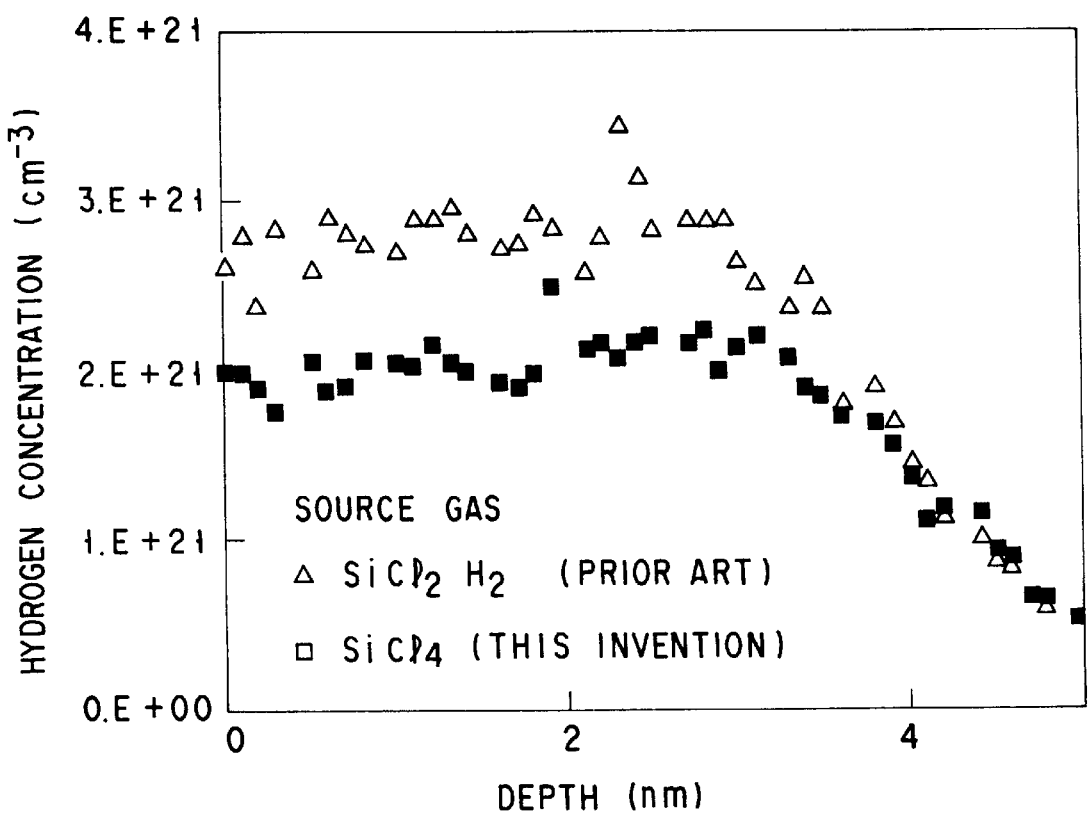
FIG. 2 is a graph showing hydrogen concentration versus depth of the film with respect to a silicon nitride film of the present invention (Embodiment 1) and a conventional silicon nitride film.

FIG. 2 shows a depth profile of the hydrogen concentration in the depth direction with respect to the silicon nitride film of the present invention (Embodiment 1) and a conventional silicon nitride film. The conventional silicon nitride film is formed by employing a mixed gas of dichlorosilane and ammonia as a source gas. Other conditions are the same as those employed in Embodiment 1 of the present invention. It is apparent from FIG. 2, the concentration of hydrogen contained in the silicon nitride film of Embodiment 1 is lower than that of the conventional silicon nitride film. The reason is considered as follows:

In the case of the conventional silicon nitride film, a mixed gas of dichlorosilane and ammonia is used as a source gas. Dichlorosilane is a substance having a Si—H bond (hydrogen directly bonds to silicon). Hydrogen of dichlorosilane is likely to enter the film. It is therefore considered that the concentration of hydrogen contained in the conventional nitride film is high.

Whereas, in the case of the silicon nitride film according to this embodiment, a mixed gas of tetrachlorosilane and ammonia is employed as a source gas. Since tetrachlorosilane does not have an Si—H bond, hydrogen concentration of the silicon nitride film will not increase, unlike the case where dichlorosilane is employed.

Figure 3:
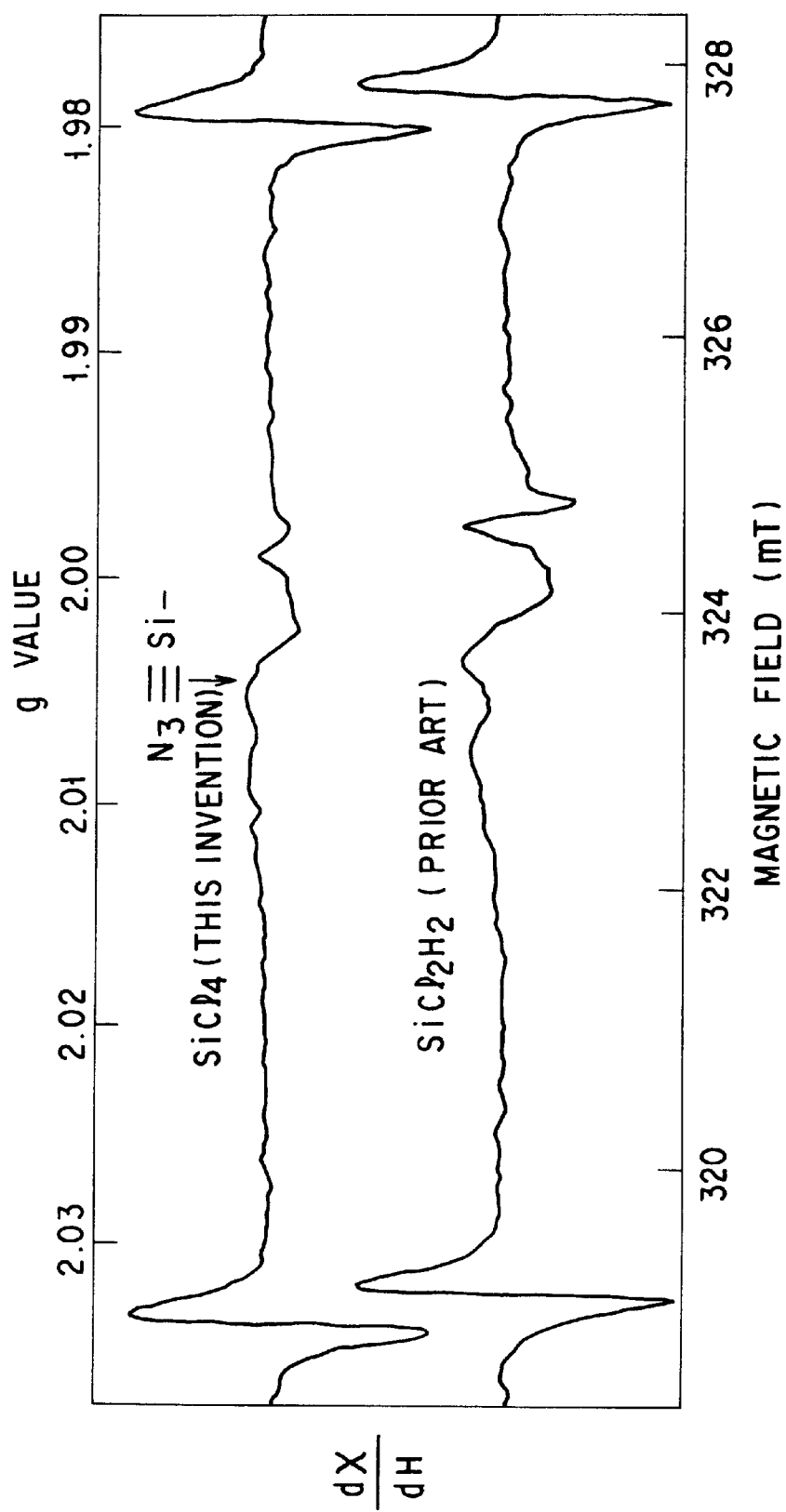
FIG. 3 is a graph showing results of ESR absorption spectra with respect to a silicon nitride film of the present invention (Embodiment 1) and a conventional silicon nitride film.

FIG. 3 shows the results of ESR (electron spin resonance) absorption spectra with respect to the silicon nitride film of this embodiment and conventional silicon nitride film. It is apparent from FIG. 3 that the silicon nitride film of this embodiment has dangling bonds (indicated by $N_3Si$— in FIG. 3) but lower than the conventional silicon nitride film. Although ESR is employed as an analytical method herein, FT-IR (Fourier-transform infrared) absorption may be used.

Figure 4:
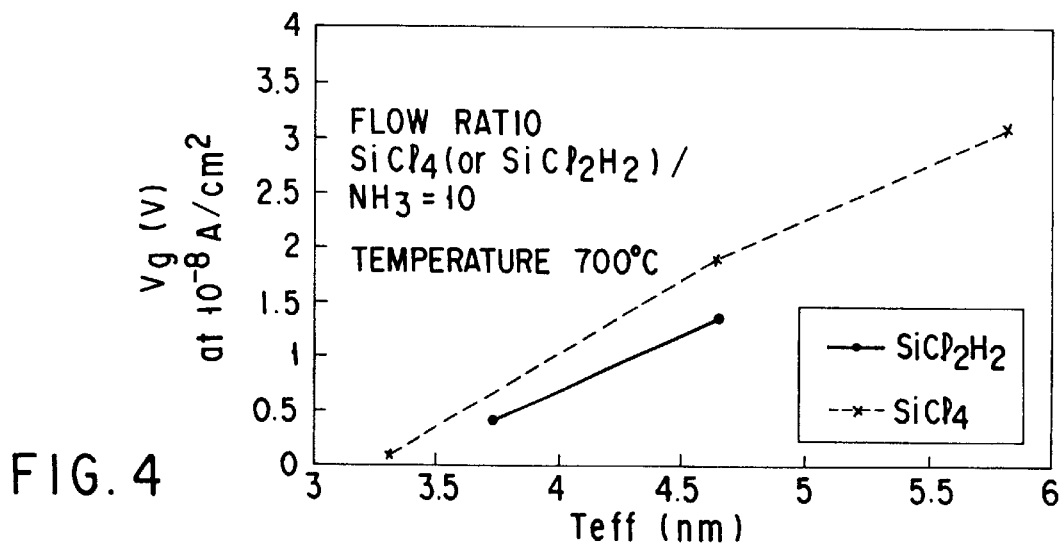
FIG. 4 is a graph showing the relationship between a film thickness and a gate voltage at $10^{-8}$ A/cm$^2$ of a silicon nitride film of the present invention (Embodiment 1) and a conventional silicon nitride film.

Using the silicon nitride film of this embodiment and the conventional silicon nitride film as a gate insulating film, MIS structures were formed respectively. The MIS structures were checked for current leakage (I-V characteristics). The results are shown in FIG. 4. In FIG. 4, film thickness "Teff" (expressed in conversion to a silicon oxide film thickness) is plotted on the ordinate axis, gate voltage Vg (obtained at a current supply of $1\times10^{-8}$ $A/cm^2$) is plotted on the abscissa. It is apparent from FIG. 4 that the silicon nitride film of this embodiment is a lower leakage current than a conventional silicon nitride film (using $SiCl_2H_2$)

Figure 5:
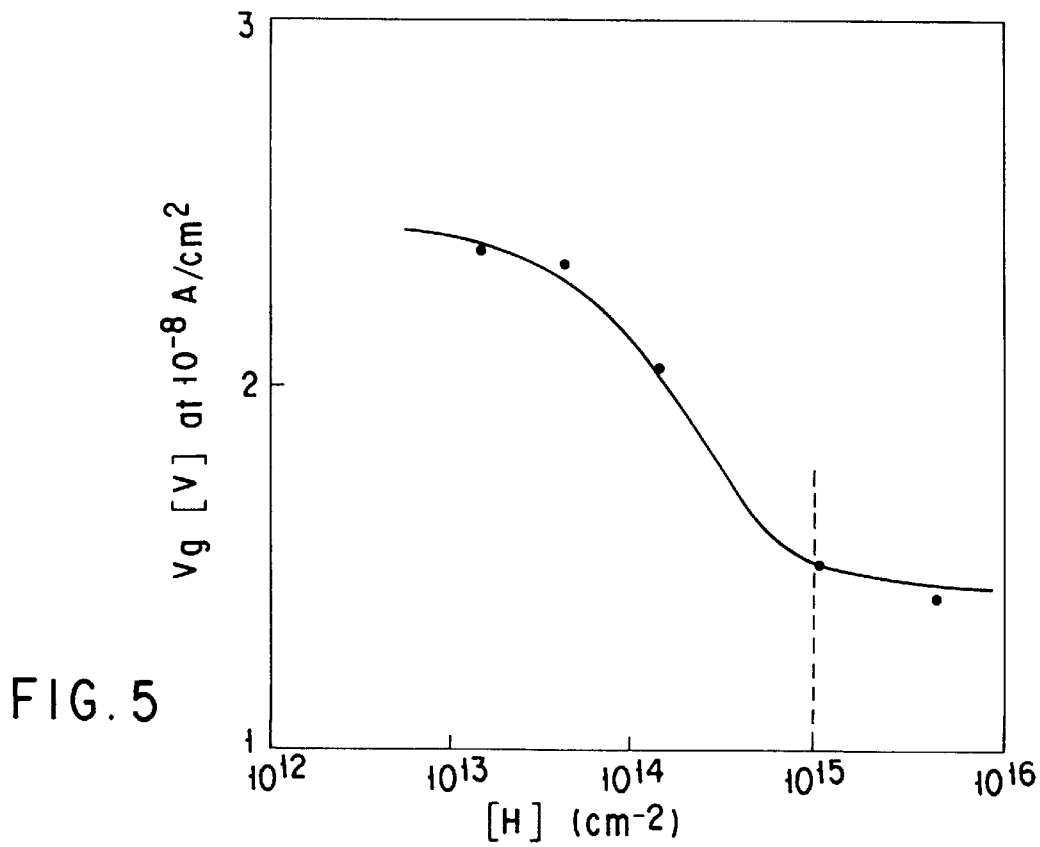
FIG. 5 is a graph showing the relationship between hydrogen density per unit area of a silicon nitride film and leakage current.

FIG. 5 shows the relationship between the hydrogen surface density and the leakage current of the silicon nitride film having a substantial thickness of 5 nm thick. From FIG. 5, it is found that the leakage current suddenly decreases when a hydrogen density per unit area (in the case where the silicon nitride film has 5 nm thickness) reaches $1\times10^{15}$ $cm^{-2}$ or less. This is explained as follows.

A number of traps are known to be present in the silicon nitride film in the ratio of about 1/10 relative to the hydrogen density.

Provided that the hydrogen density per unit area is $1\times10^{15}$ $cm^{-2}$, a trap density will be $\times10^{14}$ $cm^{-2}$. If one trap have an effect on the area (1 nm) around the trap, the leakage current will conduct through the trap. Provided that the hydrogen density per unit area is less than $1\times10^{15}$ $cm^{-2}$, current will mainly flow without passing though the trap, with the result that the amount of leakage current decreases. It is therefore ideal that the trap density is further reduced in the order of two digits, or to reduce to $\times10^{13}$ $cm^{-2}$ or less in terms of the hydrogen density.

To reduce the hydrogen density per unit area, it is effective to reduce not only the hydrogen density but also film thickness. Since the silicon nitride film herein has a hydrogen density of $1.2\times10^{21}$ $cm^{-3}$ per unit area, it is required to reduce the film thickness to 8 nm or less in order to attain a hydrogen density of $1\times10^{15}$ $cm^{-2}$ or less per unit area. For this reason, the film thickness is set at 4 nm in this embodiment. This is because, if the film thickness is less than 4 nm, it is difficult to control the film thickness because the deposition time is very short. In other words, it is possible to form a thin film under good control as long as the film thickness is within the range of 4 nm or more. Hence, it is preferable that the film thickness of the silicon nitride film be within the range from 4 nm to 8 nm.

Figure 6:
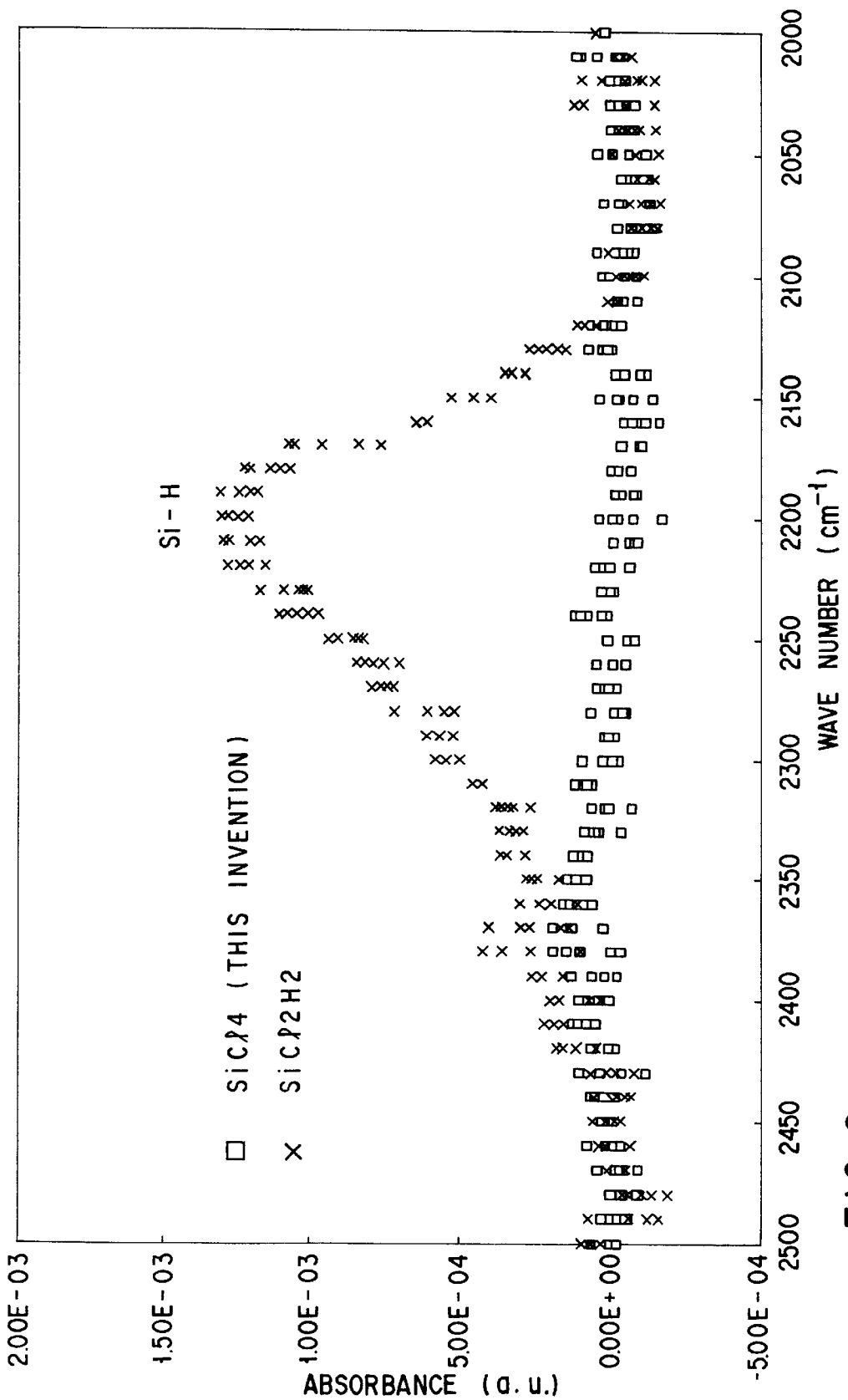
FIG. 6 is a graph showing measuring results of an FT-IR absorption spectrum of a silicon nitride film according to the present invention (Embodiment 1) and a conventional silicon nitride film.

FIG. 6 shows the measuring results of each of FT-IR absorption spectra of the silicon nitride film according to Embodiment 1 (formed by using a $SiCl_4$ gas as a source gas) and a conventional silicon nitride film (using a $SiCl_2H_2$ gas). It is apparent from FIG. 6 that the number of Si—H bonds in the silicon nitride film of this embodiment is so lower than that of the conventional one as not to be detected.

As described in the foregoing, it is possible to form a silicon nitride film (capacitor insulating film) having substantially no Si—H bond at a hydrogen density of $1\times10^{15}$ $cm^{-2}$ or less per unit area by the low-pressure CVD method employing a mixed gas of tetrachlorosilane and ammonia as a source gas. It is possible to form the silicon nitride film with a sufficiently low content of Si—H bonds, which is a mainly responsible for the trap formation due to a weak bonding ability. By virtue of this, the leakage current through the silicon nitride film can be reduced. As a result, the amount of charge accumulated in the capacitor can be increased as compared to that of the conventional one having the same capacitor area.

It is further possible to increase the charge amount accumulated in the capacitor than that of the conventional one even if the capacitor area of the present invention is reduced. This means that depth of a trench can be reduced in the case of a trench capacitor and height of the capacitor can be reduced in the case of a stacked capacitor.

Since the silicon nitride film is formed under good control as long as the film thickness is within the range of 4 nm or more, a capacitor size can be reduced easily.

Although the mixed gas of tetrachlorosilane and ammonia is used as a source gas in this embodiment, another source gas may be used. For example, a mixed gas of tetrachlorosilane and trichloronitride may be used. Furthermore, a tetrakisdimethylaminosilane gas and a trichlorosilylazide gas may be used. A point is that any gas may be used as a silicon source gas as long as it has no Si—H bond. In addition, other the film-formation conditions except the source gas are not limited to the aforementioned values.

Although the case is explained where a capacitor is formed on a flat substrate in this embodiment, the present invention can be applied to capacitors having a three dimensional structure such as a trench capacitor and a stacked capacitor. The present invention can be applied to a gate insulating film and other insulating films.

Although silicon nitride film having a low leakage current is formed by using the specific source gas in this embodiment, the silicon nitride film having a low leakage current may be formed by using a mixed gas of dichlorosilane and ammonia (containing a Si—H bond) as the source gas as in the conventional case.

When the silicon nitride film is formed by a lower-pressure CVD method using the mixed gas of dichlorsilane and ammonia as a source gas, hydrogen present in the silicon nitride film can be reduced if heat treatment is applied after the film deposition. Consequently the number of Si—H bonds decreases, so that the leakage current is lowered.

In this case, if the heat treatment is performed at low temperature, outdiffusion of hydrogen rarely occurs. It is therefore preferable that the heat treatment is performed at 900° C. or more, and more preferably, 950° C. or more. Whereas, if the heat treatment is performed at an excessively high temperature, other elements included in other regions of the device will be adversely affected. Therefore, the upper limit of the treatment temperature may be set at 1100° C. or less, and more preferably, at 1050° C. or less.

Although the low-pressure CVD method is employed as the film formation method of the silicon nitride film, thermal nitriding may be employed. Furthermore, after the silicon nitride film is formed to a predetermined thickness by the thermal nitriding, the silicon nitride film may be completed by the low-pressure CVD method.

Embodiment 2

FIGS. 7A–7I show cross-sectional views of a DRAM memory cell according to Embodiment 2 of the present invention, for sequentially showing the manufacturing steps thereof.

Figure 7A:
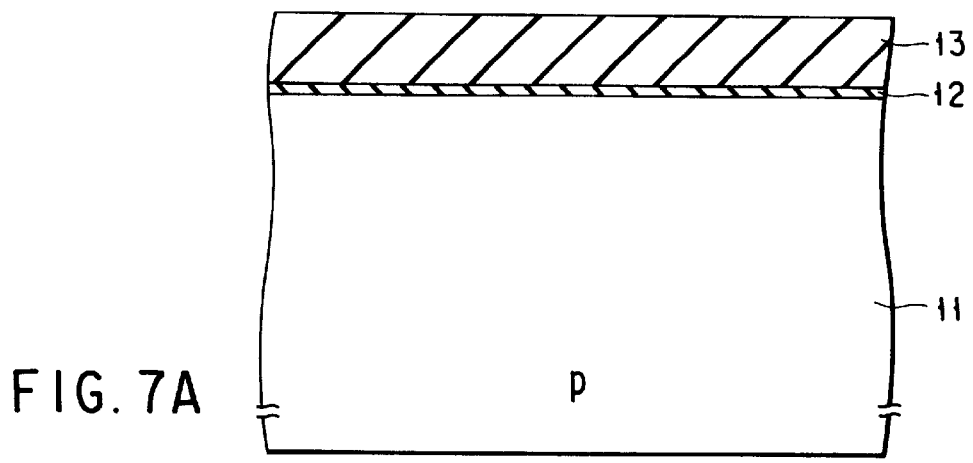
FIGS. 7A–7I are cross-sectional views of a DRAM memory cell according to Embodiment 2 of the present invention, for sequentially showing the manufacturing steps thereof.

As shown in FIG. 7A, a silicon oxide film 12 (10 nm thick) is formed over a p-type silicon substrate 11 (resistivity: 10 Ωcm, orientation: <100>) by a thermal oxidation method. Thereafter, a silicon nitride film 13 (500 nm) is formed on the silicon oxide film 12 by a CVD method.

Figure 7B:
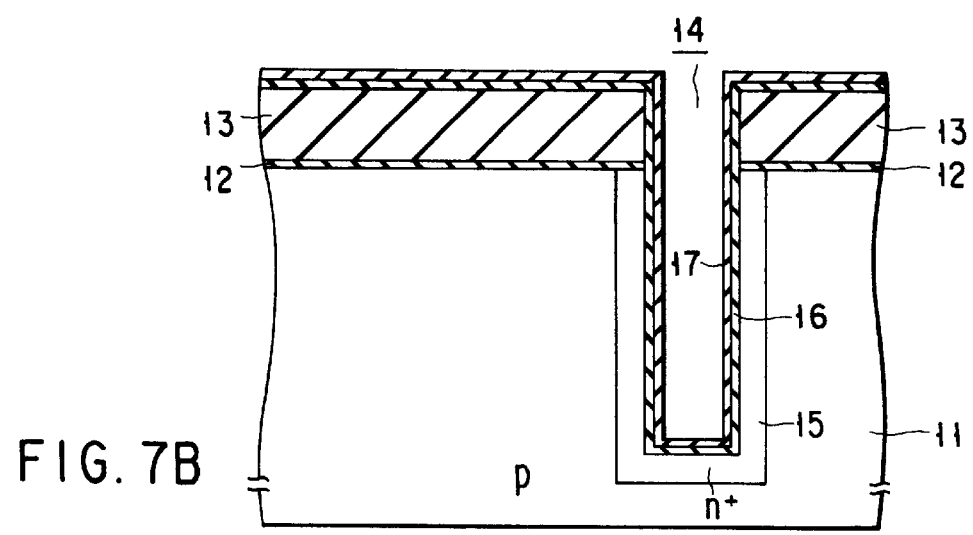

As shown in FIG. 7B, after a trench 14 is formed by photolithography and etching, a highly doped n-type diffusion layer 15 (serving as a plate electrode) is formed on the surface of the p-type silicon substrate 11 corresponding to the bottom surface and the side surface of the trench 14, by a well known method.

A first silicon nitride film 16 (serving as a first capacitor insulating film) is formed by a nitriding treatment in an $NH_3$ (as a nitriding agent) atmosphere at 950° C. for one hour.

A second silicon nitride film 17 of 6 nm thick (serving as a second capacitor insulating film) is formed on the first silicon nitride film 16 by a CVD method. In this case, it is preferable that the same gas employed as in Embodiment 1 be used as the source gas, and that a hydrogen density per unit area be $1 \times 10^{15}$ $cm^{-2}$ or less.

Thereafter, the thermal nitriding of the second silicon nitride film 17 is performed by annealing the film 17 at 950° C. for one hour in an $NH_3$ atmosphere. In this way, a dangling bond extending from the surface of the second silicon nitride film 17 up to 2 nm in depth is terminated with nitrogen.

Figure 7C:
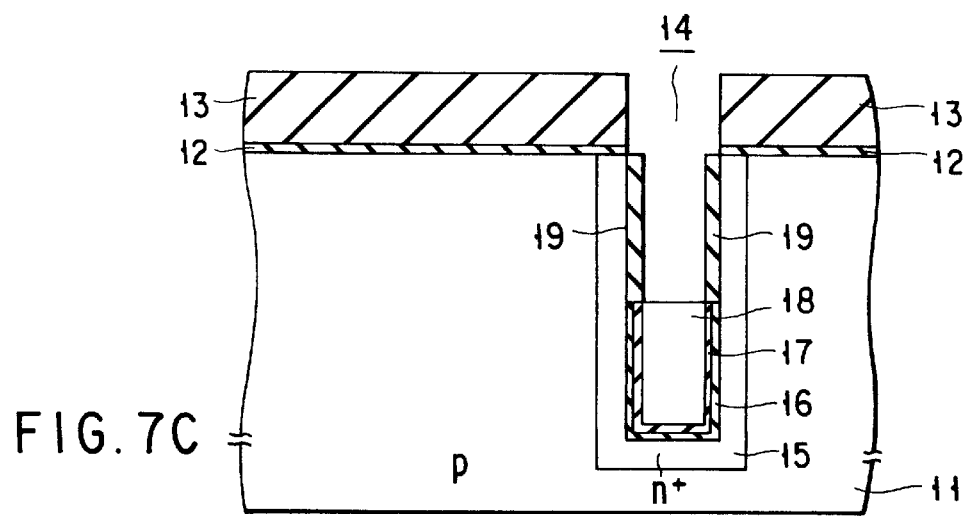

As shown in FIG. 7C, a phosphorus-doped polysilicon film serving as a first storage node electrode 18 is deposited over an entire substrate so as to fill the trench 14. Subsequently, the phosphorus-doped polysilicon film is polished by a chemical mechanical polishing (CMP) method until the surface of the silicon nitride film 13 is exposed.

The phosphorus-doped polysilicon film is etched back by RIE to form the first storage node electrode 18. At the same time, the portion of the silicon nitride films 16 and 17 on the sidewall of the trench 14 which extends higher than the first storage node electrode 18, is removed.

Thereafter, a post oxide film 19 is formed on the portion of the sidewall of the trench 14 which extends higher than the first storage node electrode 18.

Figure 7D:
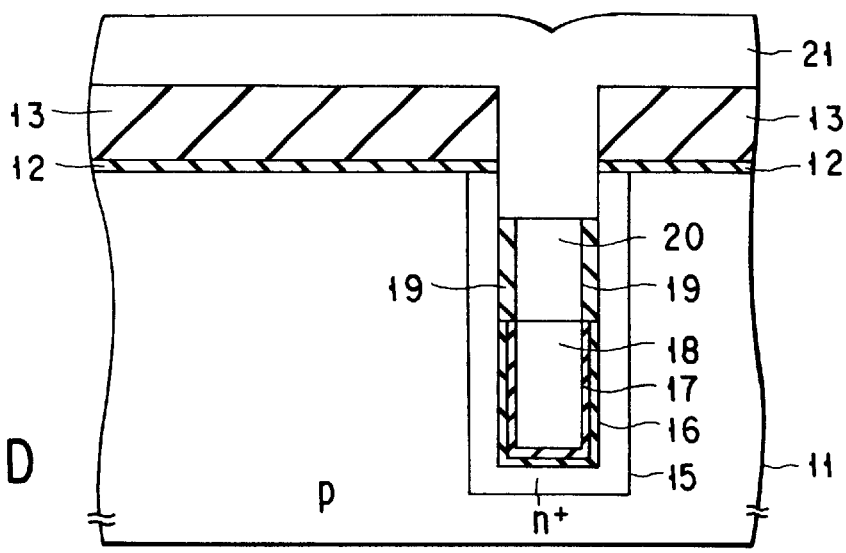

As shown in FIG. 7D, the second phosphorus-doped polysilicon film (serving as the second storage node electrode 20) is deposited over the entire surface of the resultant surface so as to fill the trench 14.

Thereafter, CMP polishing is performed in the same manner as in the case of the first storage node electrode 18 and then RIE etching back is performed to form the second storage electrode 20.

After the post oxide film 19 is removed from the portion of the sidewall of the trench 14 which extends higher than the second storage node electrode 18, a third boron-doped polysilicon film 21 (serving as a third storage node electrode) is formed so as to fill the trench 14.

Figure 7E:
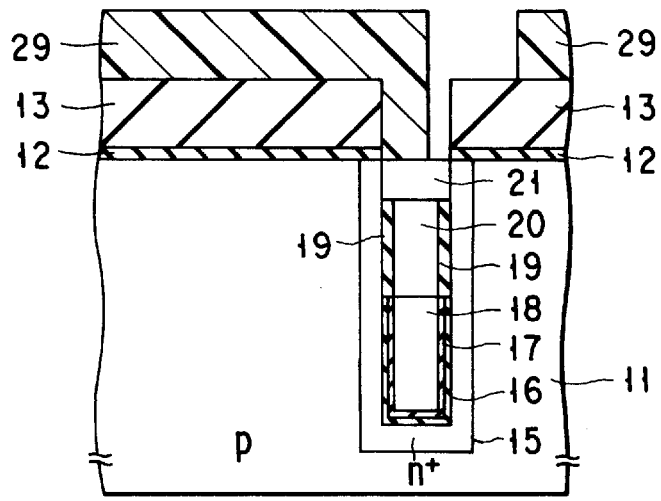

As shown in FIG. 7E, after the third phospohrusdoped polysilicon film 21 is etched back up to the substrate surface, a resist pattern 29 is formed. The third phosphorus-doped polysilicon film 21 is selectively removed by RIE using a resist pattern 29 as a mask.

Figure 7F:
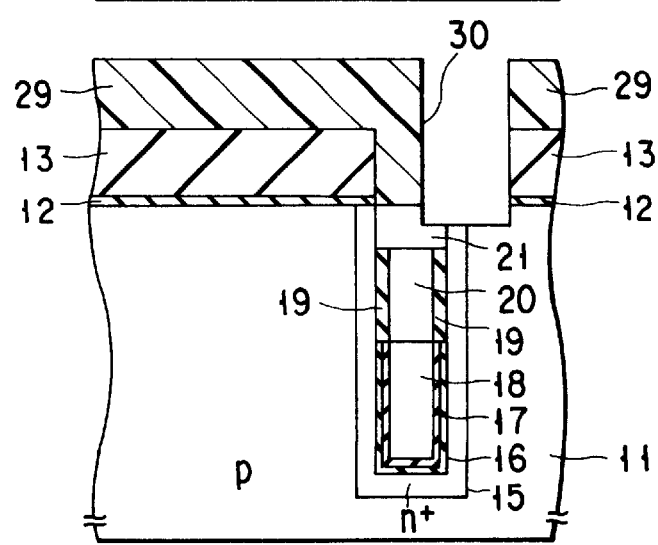

As shown in FIG. 7F, the silicon nitride film 13 is selectively etched with a different etchant using the resist pattern 29 as a mask.

Furthermore, the silicon oxide film 12 is selectively removed with a further different etchant using the resist pattern 29 as a mask.

Using the resist pattern 29 as a mask, a part of the remaining third phosphorus-doped polysilicon film 21 and a part of the p-type silicon substrate 11 are removed by RIE, thereby forming an element isolation groove 30. Thereafter, the resist pattern 29 is removed.

Figure 7G:
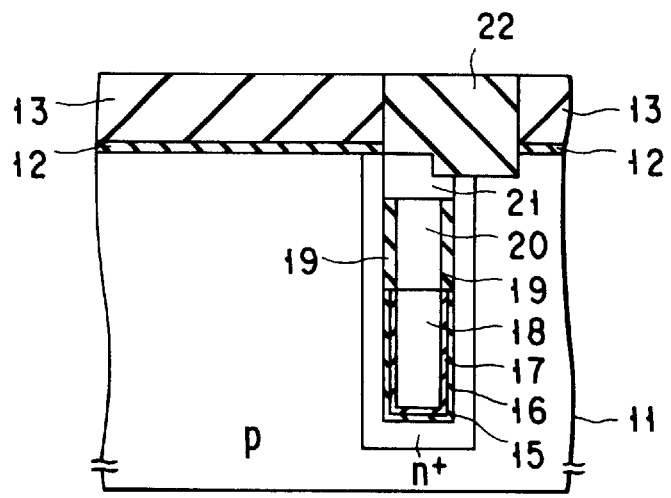

As shown in FIG. 7G, a TEOS (tetraethylorthosilicate) film (serving as the device isolation insulating film 22) is deposited over the resultant surface so as to fill the device isolation trench. Thereafter, the TEOS film is removed by a CMP method until the silicon nitride film 13 is exposed.

Figure 7H:
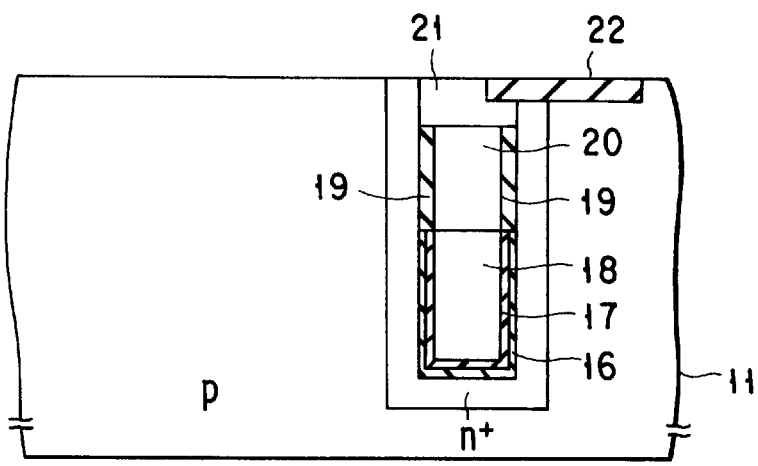

As shown in FIG. 7H, the device isolation insulating film 22 is selectively etched with hydrogen fluoride (HF) up to the substrate surface. Then, the silicon nitride film 13 is selectively removed with hot phospheric acid. Thereafter, the silicon oxide film 12 is selectively removed with HF.

Figure 7I:
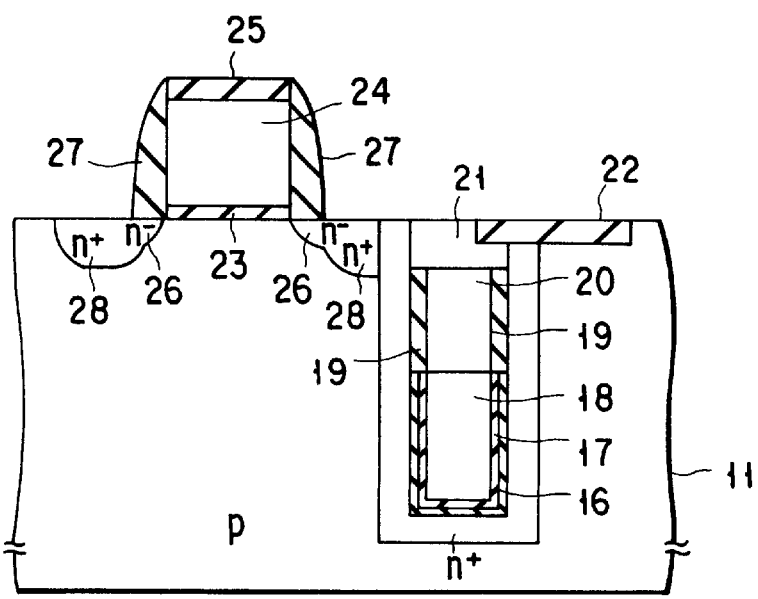

As shown in FIG. 7I, after a gate oxide film 23 is formed on the silicon substrate 11 in the device region by a thermal oxidation method, a phosphorusdoped poly crystalline silicon film (serving as a gate electrode 24) and an insulating film (serving as the upper gate insulating film 25) are sequentially formed. Thereafter, these films 24 and 25 are processed by photolithography and etching to form the gate electrode 24 and the upper gate insulating film 25.

Furthermore, using the upper gate insulating film 25 and the gate electrode 24 as a mask, n-type dopant ions are injected into the substrate surface to form a shallow source/drain region (LDD) 26 having a low dopant content.

After a silicon nitride film of 10nm thick (serving as a gate sidewall silicon nitride film 27) is deposited over the resultant surface by a CVD method, the silicon nitride film is anisotoropically etched by RIE, thereby leaving the silicon nitride film selectively on the sidewall of the gate electrode 24 28 and the upper gate insulating film 25. In this way, the gate sidewall silicon nitride film 27 is formed.

Finally, using the gate electrode 24, the upper gate insulating film 25, and the gate sidewall silicon nitride film 27 as a mask, n-type dopant ions are injected into the substrate surface to form a highly doped source/drain region 28.

Note that the n-type dopant contained in the source/drain regions 26, 28 may be activated simultaneously or independently.

Figure 8:
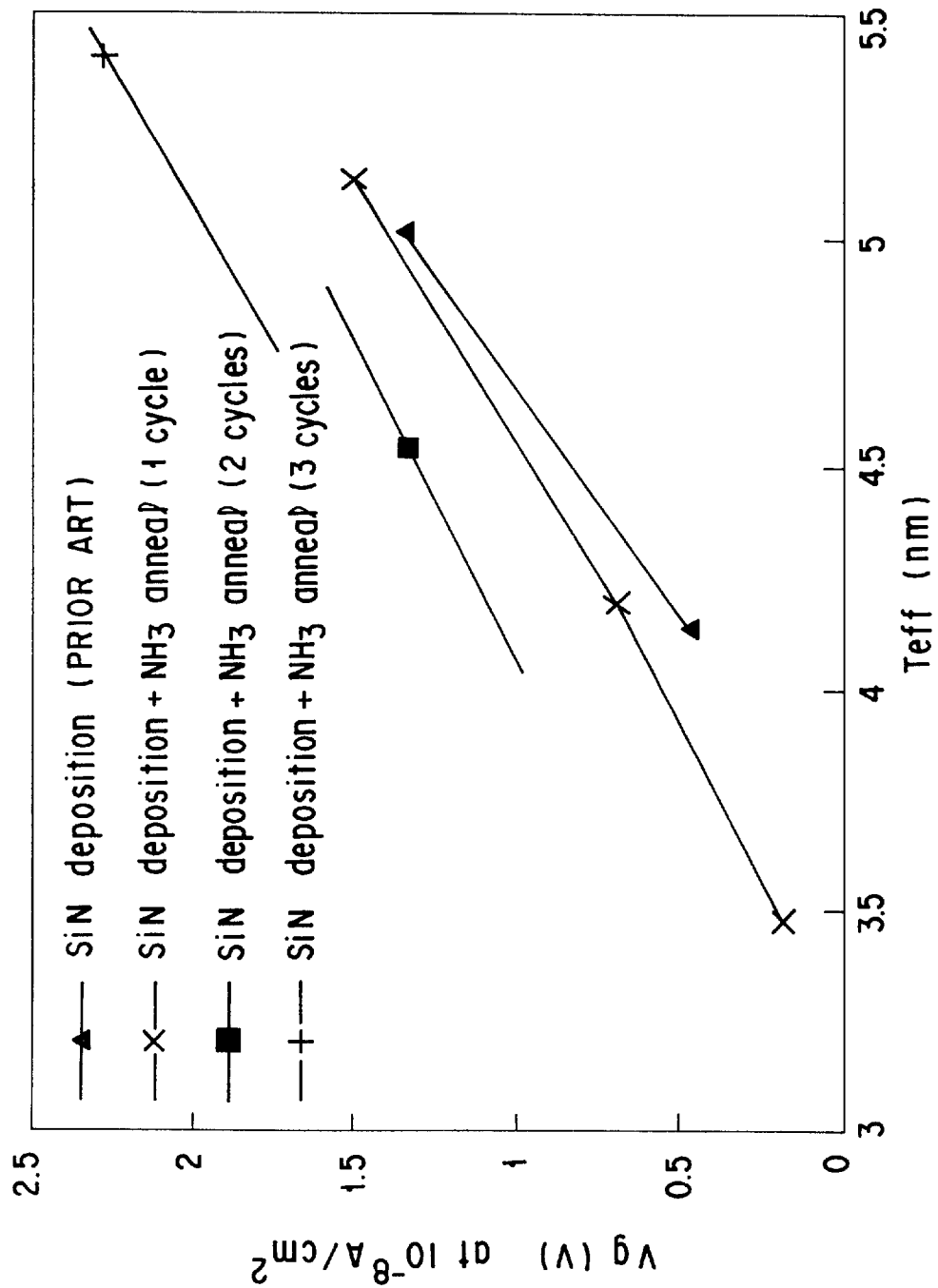
FIG. 8 is a graph showing the relationship between a film thickness and a gate voltage at $10^{-8}$ A/cm$^2$ of a trench capacitor according to Embodiment 2 and a trench capacitor using a conventional silicon nitride film.

FIG. 8 shows I-V characteristics of a trench capacitor formed in accordance with this embodiment and a trench capacitor using a conventional silicon nitride film. It is apparent from FIG. 8 that the lealage current from the trench capacitor of this embodiment with an $NH_3$ anneal (1 cycle) is reduced.

This is because dangling bonds in the second silicon nitride film 17 are terminated with nitrogen during the thermal nitriding (annealing) performed in an $NH_3$ atmosphere, thereby decreasing the number of traps responsible for the leakage current.

The same effect can be obtained if the second silicon nitride film 17 is formed by using a conventionally-used source gas. It goes without saying that the hydrogen density per unit area is preferably set at $1 \times 10^{15}$ cm$^{-2}$ or less by using the source gas of Embodiment 1.

It is possible to set the hydrogen density per unit area at $1 \times 10^{15}$ cm$^{-2}$ or less depending upon the thermal nitriding conditions. More specifically, to obtain the hydrogen density of $1 \times 10^{15}$ cm$^{-2}$ or less, the thermal nitriding is preferably performed within the temperature range of 900° C. to 1100° C., and more preferably, in the range of 950 to 1050° C.

When the thermal nitriding is performed under an $NH_3$ atmosphere, it is preferably performed for 30 minutes or more at 700° C. and for 10 minutes or more at 900° C. To reduce the trapping density effectively, thermal annealing is preferably performed at a high temperature for a long time, desirably, at 950° C. for one hour as exemplified by this embodiment.

The nitriding agent is not limited to $NH_3$. For example, $NF_3$, $N_2$, and NO may be used. The point is that any agent may be used as long as it can terminate the dangling bond present in the silicon nitride film.

Embodiment 3

Figure 9A:
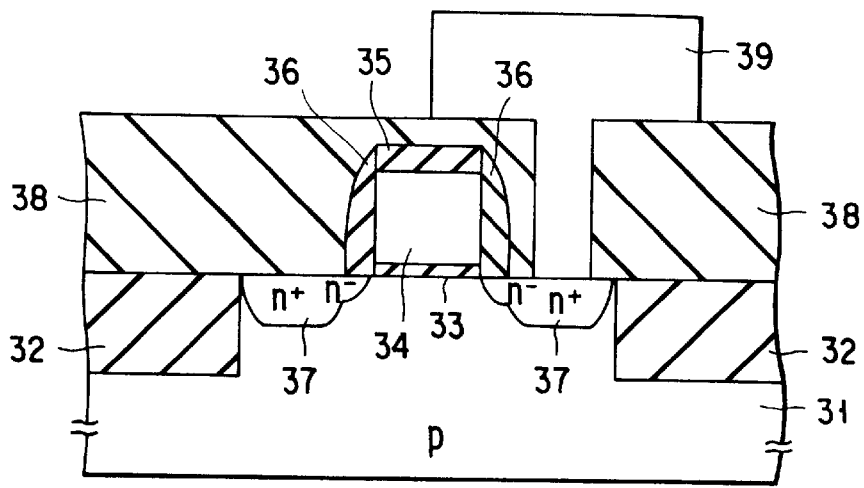
FIGS. 9A–9C are cross-sectional views of a DRAM cell according to Embodiment 3 of the present invention, for sequentially showing manufacturing steps thereof.
Figure 9B:
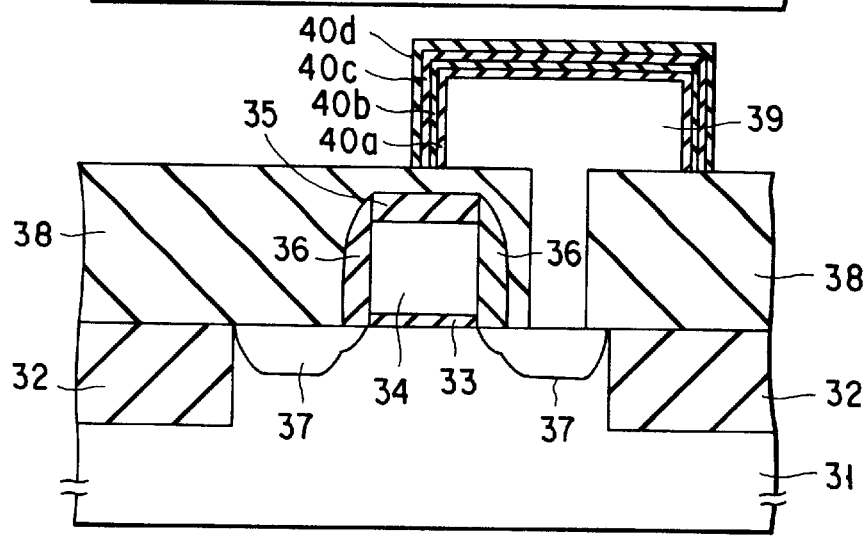
Figure 9C:
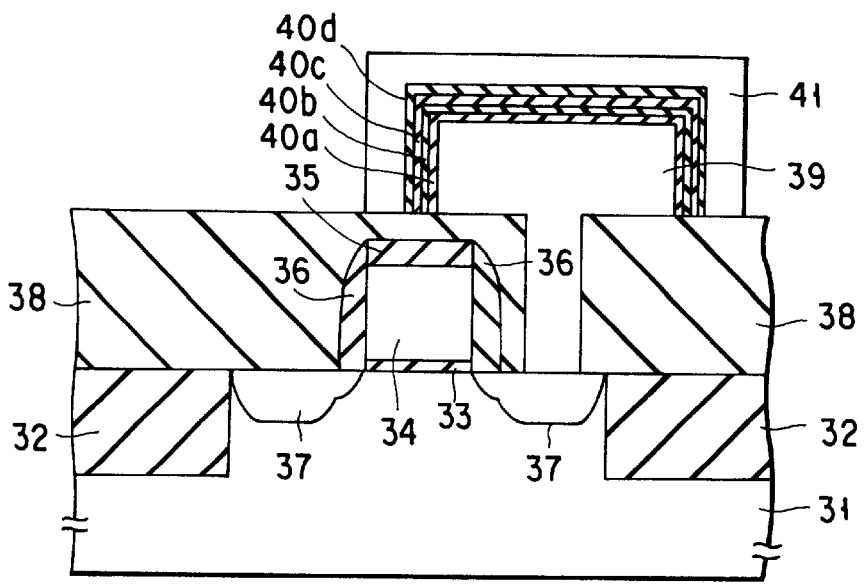

FIGS. 9A–9C are cross-sectional views of a DRAM memory cell according to Embodiment 3 of the present invention, for sequentially showing manufacturing steps thereof. Only surface portion of a silicon nitride film is thermally nitrided in Embodiment 2; however, an entire silicon nitride film is nitrided in this embodiment.

As shown in FIG. 9A, a MOS transistor is formed on a p-type silicon substrate 31 by a well-known method. The MOS transistor of FIG. 9A basically includes a device-isolation insulating film 32, a gate oxide film 33, a gate electrode 34, an upper gate insulating film 35, a gate sidewall insulating film 36, and source/drain regions 37 having an LDD structure.

Furthermore, an interlayer insulating film 38 is deposited over the entire surface. After a groove reaching one of the source/drain regions 37 is formed in the interlayer insulating film 38, a storage node electrode 39 is formed of a polycrystalline silicon film.

As shown in FIG. 9B, the surface of the storage node electrode (polycrystalline silicon film) 39 is nitrided at 950° C. for one hour in an $NH_3$ atmosphere using $NH_3$ as a nitriding agent. A first silicon nitride film 40a of about 2 nm thick (serving as a first capacitor insulating film) is formed on the surface of the storage node electrode (polycrystalline silicon film) 39.

Next, a second silicon nitride film 40b of 2 nm thick (serving as a second capacitor insulating film) is formed on the first silicon nitride film 40a by a CVD method. Thereafter, the entire second silicon nitride film 40b is nitrided at 950° C. for one hour in a nitrogen atmosphere using $NH_3$ as a nitriding agent. As a result, dandling bonds in the film are terminated.

Thereafter, the aforementioned step is repeated once more to form third and fourth silicon nitride films 40c, 40d which contain dandling bonds with the end terminated. In this case, it is preferable that the same gas employed as in Embodiment 1 be used as the source gas for the silicon nitride films 40b to 40d, and that a hydrogen density per unit area be $1 \times 10^{15}$ cm$^{-2}$ or less.

Finally, as shown in FIG. 9C, after the polycrystalline silicon film serving as a plate electrode 41 is deposited, the polysilicon film and the silicon nitride films 40a–40d are patterned in a predetermined form. As a result, a DRAM memory cell is completed.

In this embodiment with an $NH_3$ anneal (3 cycles), the leakage current can be reduced for the same reasons as in Embodiment 1, as shown in FIG. 8. In this case, since the entire silicon nitride films 40b–40d are thermally nitrided, the leakage current can be further reduced.

Note that the thickness of the silicon nitride films 40b–40d is set at 2 nm or less. This is because the nitriding agent cannot be dispersed in excess of 2 nm in depth when the thermal nitriding is performed at 950° C. for one hour. In this embodiment, a structure formed of a four-layered silicon nitride film is explained. However, the structure may be formed of five layers or more, and either two layers or three layers.

In Embodiments 2 band 3, $NH_3$ and hydrogen may be simultaneously supplied in the thermal nitriding step. The hydrogen supply may improve the efficiency in terminating operation of the dangling bond. However, not to recreate Si dangling bonds from Si—H bonds, the termination may be preferably performed with nitrogen whose bonding strength is higher than that of hydrogen.

Embodiment 4

In Embodiments 2 and 3, the silicon nitride film is thermally nitrided. However, in this embodiment, there will be explained the case where a silicon oxide film is thermally nitrided.

First, a native oxide film formed on the surface of silicon substrate is thermally nitrided at 900° C. Then, a silicon oxide film (2 nm thick) is formed by a CVD method.

The silicon oxide film is formed at 750° C. and a pressure of 0.3 Torr while supplying a mixed gas of $SiCl_2H_2$ and $N_2$ as a source gas.

The silicon oxide film is thermally nitrided at 950° C. for one hour in an $NH_3$ atmosphere as a nitriding agent.

The formation of the silicon oxide film and the thermal nitriding treatment are repeated to form a silicon nitride oxide film (substantial thickness 6 nm).

The dangling bonds present in the film are terminated with nitrogen even in this method. Since the number of traps is reduced, a silicon nitride oxide film having a small leakage current is formed.

In place of the silicon oxide film, a silicon film may be thermally nitrided to form the silicon nitride film. For example, after an amorphous silicon film (2 nm thick) is deposited, the amorphous silicon film is thermally nitrided in a nitrogen atmosphere using $NH_3$ as a nitriding agent. Even in this method, the silicon nitride film (about 2 nm thick) having a low trap density can be formed. This makes it possible to reduce the leakage current. In this case, even if polycrystalline silicon is used, the same effects can be obtained.

Embodiment 5

In Embodiments 3 and 4, it is preferable that the deposition step and the thermal nitriding step of the silicon nitride film and silicon oxide film be performed sequentially in the same apparatus and in vacuum, to improve the productivity and to reduce contamination with dust etc.

Such sequential treatments can be realized, for example, by using a hot-wall type batch treatment apparatus.

First, a silicon substrate (wafer) is loaded into an apparatus at 600° C. Then, temperature is increased to 950° C. in an $NH_3$ atmosphere under vacuum. After a heat treatment is performed for one hour, a silicon nitride film is formed on a substrate surface.

After the temperature is decreased to 700° C., a silicon nitride film (2 nm thick) is formed on a silicon nitride film by a CVD method using a mixed gas of $SiCl_2H_2$ and $NH_3$ as a source gas. Thereafter, the atmosphere is replaced with $NH_3$, and the temperature is increased to 950° C. The silicon nitride film (2 nm thick) is thermally nitrided to terminate the dangling bonds with nitrogen.

The depositing step and thermal nitriding step of the silicon nitride film are repeated, thereby forming a silicon nitride film in a desired thickness. After completion of the final thermal nitriding step, the temperature is decreased to 600° C. under the $NH_3$ atmosphere and then the silicon substrate (wafer) is unloaded from the apparatus.

Although the batch-type thermal treatment apparatus is used in this embodiment, use may be made of a thermal treatment apparatus having a multi-chamber for a single wafer processing.

The thermal treatment apparatus comprises a first thermal processing chamber for thermal nitriding treatment and a second thermal chamber for forming a silicon nitride film. A substrate surface is first nitrided in the first thermal processing chamber. Then, the silicon nitride film is formed in a first thermal processing chamber by a CVD method. Thereafter, the silicon nitride film is thermally nitrided in a second thermal processing chamber. Then, the formation of the silicon nitride film in the first thermal processing chamber and the thermal nitriding in the second thermal processing chamber are repeated to form a silicon nitride film in a desired thickness.

As described in the foregoing, a silicon nitride film having a low leakage current can be realized by setting a hydrogen density per unit area at $1 \times 10^{15}$ cm$^{-2}$ or less.

However, it is difficult to reduce the amount of chlorine and the number of N—H bonds present in the nitride film even by this method. Since the source gas is supplied in the form of a gas mixture in a conventional CVD method, a reaction proceeds in a gas phase. As a result, clustered molecules are adsorbed onto the substrate surface before removing Cl and H. Therefore, it is difficult to remove hydrogen and chlorine once incorporated into the film.

On the other hand, a digital CVD method is known for forming a film by supplying a source gas intermittently (Appl. Phys. Lett. 68(23)p. 3257(1996)). If this method is employed, a reaction can be limitedly performed only in a substrate surface.

However, in this method, if the temperature increases, the source gas itself is decomposed and deposited on a substrate. Therefore, studies have been made on the case where the film is formed at a low temperature less than 400–450° C. Because of the low temperature, the reaction is not sufficiently performed, leaving a large amount of hydrogen and chlorine in the film even if the digital CVD method is employed. As a result, the leakage current is not reduced.

Then, there will be explained the embodiment where the hydrogen as well as the chlorine contents of the nitride film can be drastically decreased.

Embodiment 6

FIGS. 10A–10E are cross-sectional views of a nitride film according to Embodiment 6 of the present invention, for showing the manufacturing steps thereof.

Figure 10A:
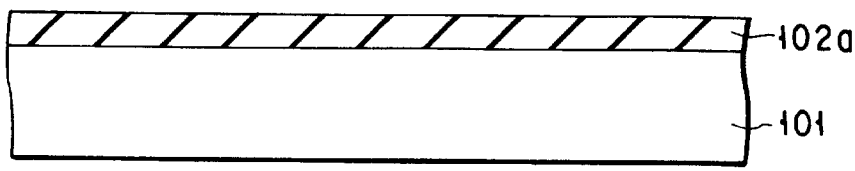
FIGS. 10A–10E are cross-sectional views of a silicon nitride film according to Embodiment 6 of the present invention, for sequentially showing the manufacturing steps thereof.

As shown in FIG. 10A, a silicon substrate 101 is washed with a mixed solution of hydrochloric acid and hydrogen peroxide. As a result, a native oxide film 102a (1.0 nm thick) is formed.

Figure 10B:
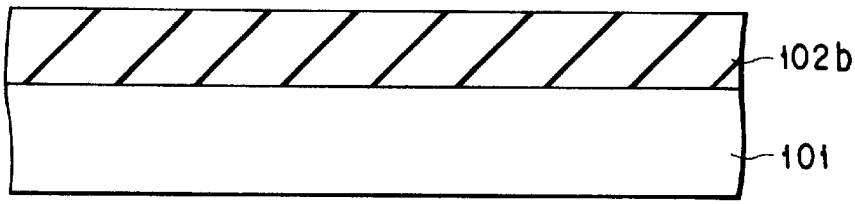

As shown in FIG. 10B, the native oxide film 102a is heated at 900° C. and 100 Torr in an ammonia atmosphere to form a thermal nitride film 102 (2 nm).

Figure 10C:
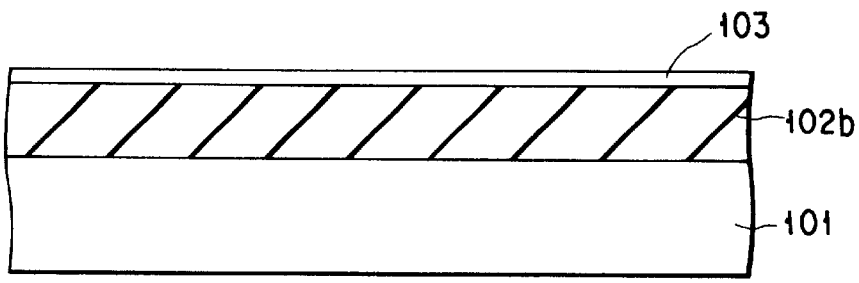

As shown in FIG. 10C, the nitrided oxide film 102b is annealed with tetrachlorosilane at 800° C. and 0.5 Torr. As a result, a silicon layer 103 of one atomic layer, which is terminated with chlorine, is formed on the surface of the thermally nitrided film.

Figure 10D:
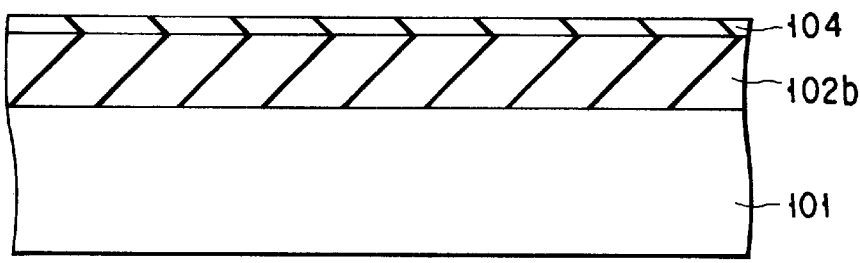

Thereafter, as shown in FIG. 10D, tetrachlorosilane in the chamber is replaced with nitrogen for one minute and the substrate is annealed in an ammonia atmosphere at 800° C. and 0.5 Torr. As a result, a silicon nitride layer 104 is formed on the surface of the substrate. Then, ammonia in the chamber is replaced with nitrogen.

Figure 10E:
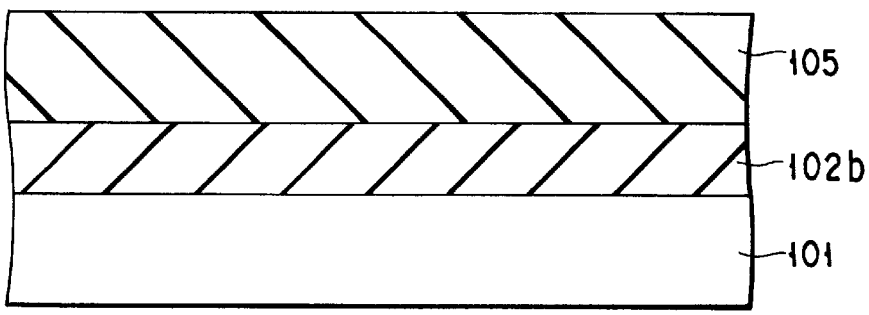

Through the aforementioned steps, a silicon nitride film of one atomic layer is formed. After this step is repeated 40 times, a silicon nitride film 105 (4.0 nm thick) can be formed as shown in FIG. 10E.

Thereafter, the resultant structure is subjected to a conventional capacitor formation step to form an MIS capacitor.

If the insulating film formation method as explained in this embodiment is employed, each of the atomic layers of a silicon nitride film is formed in a predetermined thickness. In particular, the film is formed in a predetermined thickness in a self-limiting manner, so that the reaction between tetrachlorosilane and ammonia can be induced. Since tatrachloride silicon is used as a silicon source, silicon deposition is prevented even at a high temperature. Hence, chlorine and hydrogen to be incorporated into the film can be drastically reduced.

Figure 11:
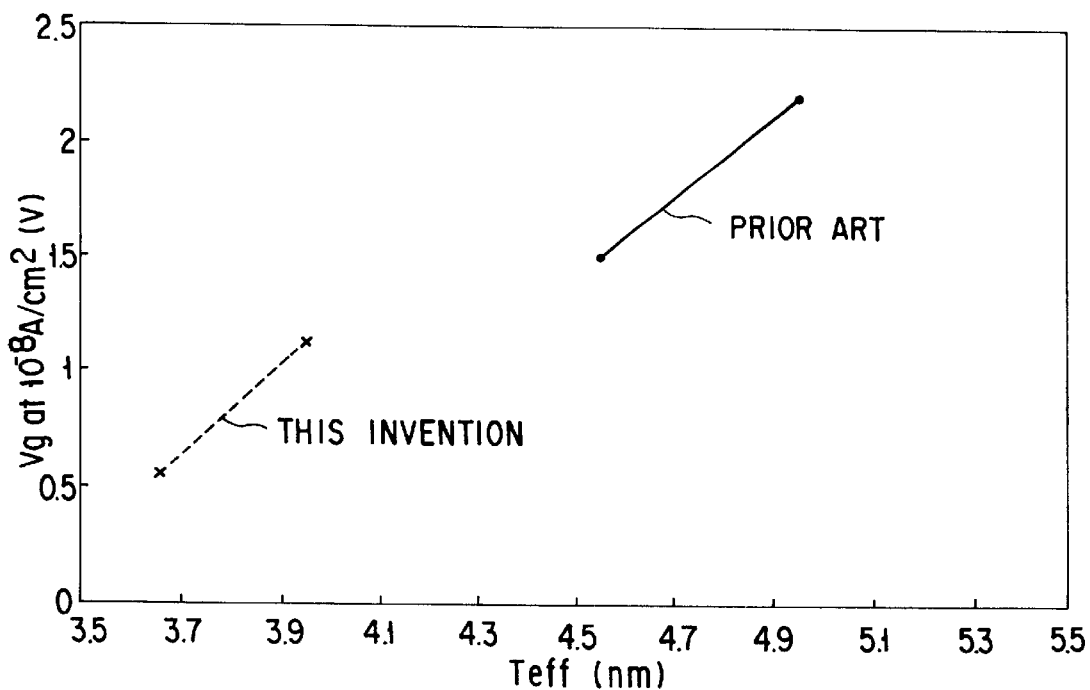
FIG. 11 is a graph showing the relationship between a film thickness and a gate voltage at $10^{-8}$ A/cm$^2$ of a capacitor of the present invention (Embodiment 6) and a conventional capacitor using a silicon nitride film.
Figure 13:
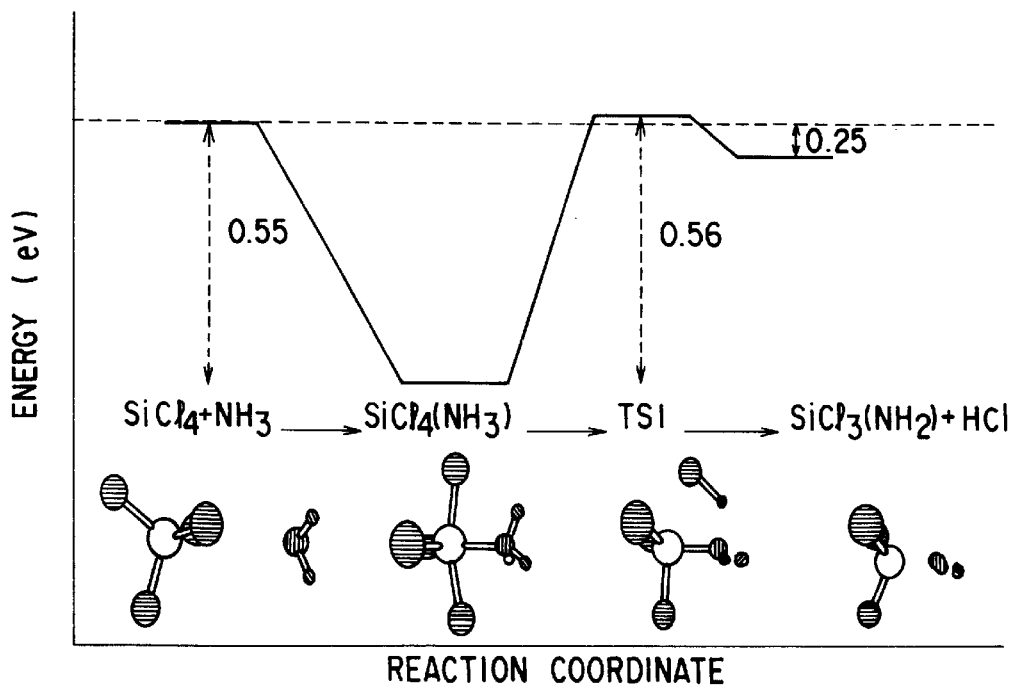
FIG. 13 is a graph showing an N—H bonding reaction of tetrachlorosilane according to Embodiment 6 in view of energy.

The leakage current is compared between the MIS capacitor of Embodiment 6 and that of Embodiment 1 whose nitride films are formed by using tetrachlorosilane and ammonia as source gases in accordance with a CVD method. The results are shown in FIG. 11. It is demonstrated that the leakage current of this embodiment is further lower than that of Embodiment 1. This is due to a decrease in Si—H content, N—H content and Si—Cl content of the nitride film.

Figure 12A:
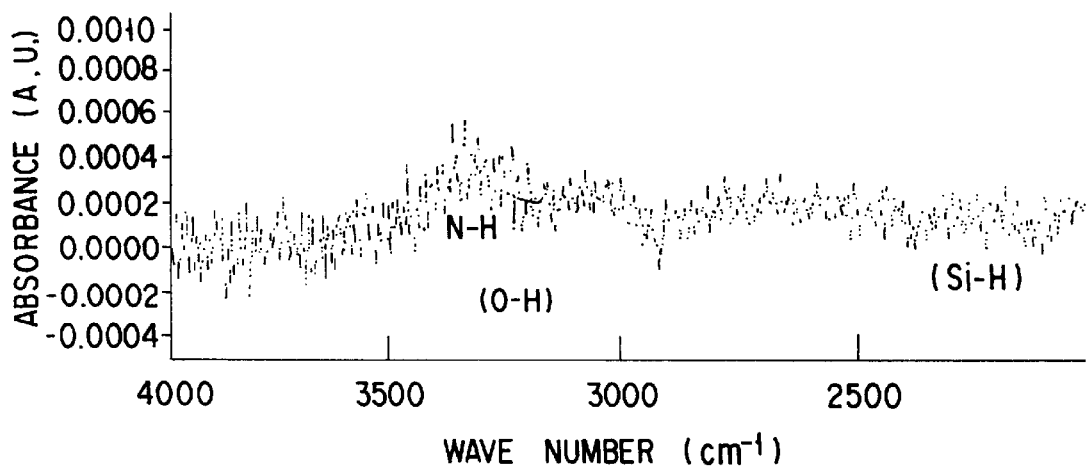
FIG. 12A is a graph showing the results of an FT-IR absorption spectrum of a silicon nitride film according to Embodiment 1 of the present invention.
Figure 12B:
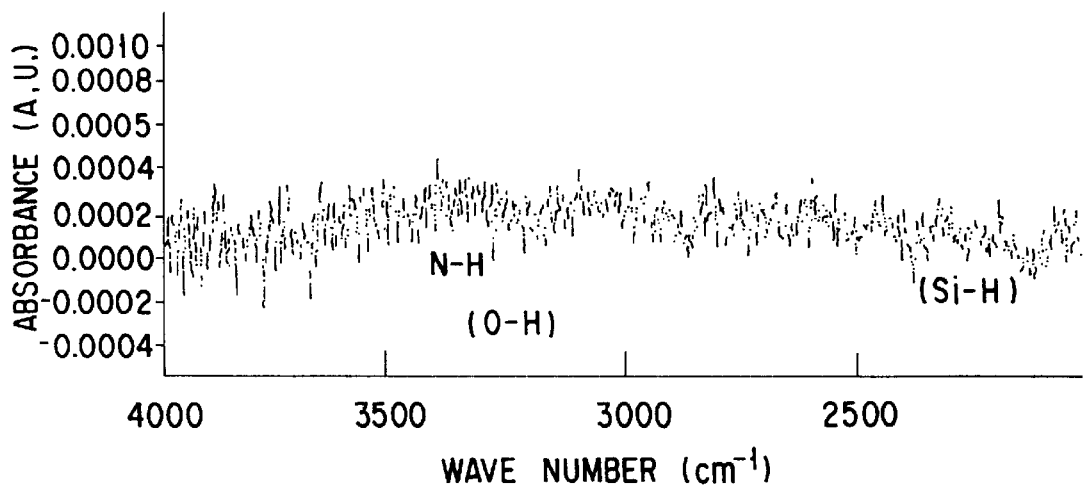
FIG. 12B is a graph showing the results of an FT-IR absorption spectrum of a silicon nitride film according to Embodiment 6.

FIGS. 12A and 12B show FT-IR absorption spectra of the silicon nitride films of Embodiments 1 and 6, respectively. The N—H bonds are slightly detected in the case of the silicon nitride film of Embodiment 1 (FIG. 12A); however, the number of the N—H bonds of Embodiment 6 (FIG. 12B) is too low to be detected.

In this embodiment, annealing is performed by using tetrachlorosilane at 800° C. and 0.5 Torr for one minute. The annealing conditions are not limited to these. The essential matter is that annealing is preferably performed at as high a temperature and as high a pressure as possible with no silicon deposition due to tetrachlorosilane. For example, the pressure may be increased to about 10 Torr. Annealing may be performed at 850° C. On the other hand, annealing in ammonia is preferably performed as high a temperature as possible. Sufficient time may be given for the replacement of nitrogen with each gas.

Although ammonia is used as a nitrogen source in this embodiment, the nitrogen source is not limited to ammonia. Use may be made of hydrazine, nitrogen trifluoride, and the like. As a silicon source, trichlorosilane and dichlorosilane may be used other than tetrachlorosilane; however, tetrachlorosilane is preferred in consideration of increasing the annealing temperature.

In this embodiment, after the silicon substrate surface is thermally nitrided, the silicon nitride film is deposited. The thermal nitriding treatment is performed for the purpose of increasing the number of adsorption points for tetrachlorosilane, thereby preventing the silicon nitride film from growing in an island form. Hence, the nitriding treatment is not required if the treatment for increasing the number of the adsorption points is performed. The number of the adsorption points may be increased by annealing the native oxide film in a hexachlorodisilane atmosphere, for example, during the step of removing a native oxide film from the substrate. Particularly, if the annealing step performed at 400° C. or less in a hexachlorodisilane atmosphere (which is a treatment for increasing the adsorption point on the native oxide without performing thermal nitriding), is adapted to the step of forming the gate insulating film of an MIS capacitor for a transistor, a quite good interface can be formed.

In this embodiment, the source gas is replaced with nitrogen. The replacement gas is not limited to nitrogen. The source gas may be replaced with either another inert gas such as argon, helium, hydrogen or hydrogen chloride.

In this embodiment, a capacitor is formed on a flat substrate. The present invention may be applied to a capacitor having a three dimensional structure such as a trench capacitor and a stacked capacitor, or a gate insulating film to be used in an MIS capacitor of a transistor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device having a capacitor, a capacitor insulating film thereof being a silicon nitride film, comprising the steps of:
   forming a silicon oxide film on a substrate;
   converting the silicon oxide film into a nitrided silicon oxide film;
   loading the substrate with the nitrided silicon oxide film in a low pressure CVD apparatus; and
   forming, on the nitrided silicon oxide film, the silicon nitride film having a thickness not more than 8 nm and substantially free from an Si—H bond by introducing a predetermined silicon source gas into the low pressure CVD apparatus.

2. The method of manufacturing the semiconductor device according to claim 1, wherein the step of forming the silicon nitride film includes a step of forming a silicon nitride film having a Si—H density per unit area of $1 \times 10^{15}$ cm$^{-2}$ or less.

3. The method of manufacturing the semiconductor device according to claim 1, wherein a silicon source gas free from an Si—H bond is used as said predetermined silicon source gas.

4. The method of manufacturing the semiconductor device according to claim 1, wherein the predetermined silicon source gas contains silicon whose bonds are entirely bonded to at least one element selected from the group consisting of silicon, nitrogen, and halogen.

5. The method of manufacturing semiconductor device according to claim 1, wherein the predetermined silicon source gas is one of tetrachlorosilane, hexachlorodisilane, tetrakisdimethylaminosilane and trichlorosilylazide.

6. The method of manufacturing a semiconductor device according to claim 1, wherein the step of forming a silicon nitride film further comprises the steps of:
   forming the silicon nitride film by using the predetermined silicon source gas having an Si—H bond;
   reducing hydrogen contained in the silicon nitride film by a heat treatment; and
   forming a silicon nitride film having an Si—H density per unit area of $1 \times 10^{15}$ cm$^{-2}$ or less.

7. The method of manufacturing semiconductor device according to claim 6, wherein the heat treatment is performed at a temperature within a range of 900° C. to 1100° C.

8. A method of manufacturing a semiconductor device comprising:
   a step of loading a semiconductor substrate into a chamber;
   a first step of introducing a silicon-containing gas into a chamber;
   a second step of performing a first annealing of the semiconductor substrate in the silicon-containing gas at a temperature within 600 to 900° C. and a pressure within 0.1 Torr to 10 Torr;
   a third step of exhausting the silicon-containing gas after the first annealing;
   a fourth step of introducing a nitrogen-containing gas after the third step;
   a fifth step of performing a second annealing of the semiconductor substrate in the nitrogen-containing gas at a temperature within 600 to 1000° C. and a pressure within 0.5 Torr to 100 Torr;
   a sixth step of exhausting the nitrogen-containing gas after the fifth step; and
   a step of repeating the first to sixth steps a plurality of times.

9. The method of manufacturing a semiconductor device according to claim 8, wherein the silicon-containing gas includes at least one of tetrachlorosilane, trichlorosilane, and dichlorosilane.

10. The method of manufacturing a semiconductor device according to claim 8, wherein the nitrogen-containing gas includes at least one of ammonia, nitrogen trifluoride, hydrazine, dimethylhydrazine and monomethylhydrazine.

11. The method of manufacturing a semiconductor device according to claim 8, further comprising, a step of thermally nitriding the semiconductor substrate before the first step.

12. The method of manufacturing a semiconductor device according to claim 8, further comprising, before the first step, the steps of:

forming a native oxide film on a surface of a semiconductor substrate; and removing the native oxide film.

13. The method of manufacturing a semiconductor device according to claim 8, further comprising, before the first step, the steps of:

forming a native oxide film on a surface of the semiconductor substrate; and annealing the native oxide film in hexachlorodisilane.

14. The method of manufacturing a semiconductor device according to claim 13, wherein a temperature of the step of annealing performed in hexachlorodisilane is 400° C. or less.

15. The method of manufacturing a semiconductor device according to claim 8, wherein the third and sixth steps include the step of replacing anyone of the silicon containing gas and the nitrogen containing gas with anyone of an inert gas, a hydrogen chloride gas and a hydrogen gas.

16. The method of manufacturing a semiconductor device according to claim 11, wherein an Si—H density per unit area of the silicon nitride film formed in the fifth step is $1\times10^{15}$ cm$^{-2}$ or less.

17. The method of manufacturing a semiconductor device according to claim 11, wherein the silicon nitride film formed in said fifth step has a film thickness of 2 nm or less.

18. A method of manufacturing a semiconductor device having a MOSFET, a gate insulating film thereof being a silicon nitride film, comprising the steps of:

forming a silicon oxide film on a substrate;

converting the silicon oxide film into a nitrided silicon oxide film;

loading the substrate with the nitrided silicon oxide film in a low pressure CVD apparatus; and forming, on the nitrided silicon oxide film, the silicon nitride film having a thickness not more than 8 nm and substantially free from an Si—H bond by introducing a predetermined silicon source gas into the low pressure CVD apparatus.

19. The method of manufacturing a semiconductor device according to claim 18, wherein the predetermined silicon source gas is one of tetrachlorosilane, hexachlorodisilane, tetrakisdimethylaminosilane and trichlorosilylazide.

20. The method of manufacturing a semiconductor device according to claim 18, wherein the step of forming the silicon nitride film further comprises the steps of:

forming the silicon nitride film by using the predetermined silicon source gas having an Si—H bond;

reducing hydrogen contained in the silicon nitride film by a heat treatment; and forming a silicon nitride film having an Si—H density per unit area of $1\times10^{15}$ cm$^{-2}$ or less, wherein the heat treatment is performed at a temperature within a range of 900° C. to 1000° C.

* * * * *